United States Patent [19]

James

[11] 4,284,712
[45] Aug. 18, 1981

[54] FABRICATION OF VIDEO DISC FLYLEADS

[75] Inventor: Edward A. James, Pennington, N.J.

[73] Assignee: RCA Corporation, New York, N.Y.

[21] Appl. No.: 167,699

[22] Filed: Jul. 11, 1980

[51] Int. Cl.³ .................. G03C 5/00; G03C 11/00
[52] U.S. Cl. .................................. 430/312; 156/634;
156/661.1; 204/15; 204/27; 204/38 E; 430/314;
430/318; 430/319; 430/320; 430/323; 430/324;
430/327; 204/18.1
[58] Field of Search .............. 430/313, 318, 314, 315,
430/319, 323, 324, 327, 320, 394, 502, 312;
156/631, 634, 661; 204/15, 18 R, 27, 38 E

[56] References Cited

U.S. PATENT DOCUMENTS

| | | | |
|---|---|---|---|
| 3,469,982 | 9/1969 | Celeste | 430/256 |
| 3,539,259 | 11/1970 | Hillman et al. | 430/319 X |
| 3,767,398 | 10/1973 | Morgan | 430/318 X |
| 3,842,194 | 10/1974 | Clemens | 178/6.6 A |
| 3,952,147 | 4/1976 | Leedom | 178/6.6 R |
| 3,960,561 | 6/1976 | Haining et al. | 430/318 X |
| 4,077,050 | 2/1978 | Dholakia | 358/128 |
| 4,162,510 | 7/1979 | Keizer | 358/128 |

Primary Examiner—Edward C. Kimlin
Attorney, Agent, or Firm—Birgit E. Morris; Allen Bloom

[57] ABSTRACT

Method for preparing a flylead from beryllium copper alloy sheet having one side include a solder layer pattern. The method includes the steps of age hardening the beryllium copper alloy sheet, laminating both sides of the sheet with a dry film photoresist, exposing the first side of the laminated alloy sheet to actinic radiation through a mask to record a first pattern comprising the flylead pattern, exposing the second side of the laminated alloy sheet to actinic radiation through a mask to record a second pattern comprising the solder layer pattern, developing the second pattern to expose the alloy sheet surface, electroplating the exposed alloy sheet surface with a solder, relaminating the electroplated second side, developing the first pattern, etching the first pattern into the alloy sheet and removing the remaining photoresist from both sides of the etched alloy sheet.

5 Claims, 12 Drawing Figures

FABRICATION OF VIDEO DISC FLYLEADS

This invention relates to a method for preparing flyleads. More particularly, this invention relates to a method for preparing flyleads for a video disc stylus by photolithography.

BACKGROUND OF THE INVENTION

U.S. Pat. No. 3,842,194 of Clemens discloses a video disc having a playback system utilizing variable capacitance. In one configuration of the Clemens system information representative of the recorded picture and sound is encoded in the form of a relief pattern in a relatively fine spiral groove on the surface of a disc record. For example, groove widths of about 2.7 micrometers and groove depths of about 0.5 micrometer may be used. During playback a pickup stylus about 2.0 micrometers wide having a thin conductive electrode thereon, for example, about 0.2 micrometer thick, engages the groove as the record is rotated by a supportive turntable. Capacitive variations between the stylus electrode and the record surface are sensed to recover the prerecorded information.

In the system of the above type the use of a relatively fine record groove and the groove engaging requirements of the pickup stylus results in a stylus tip which is extremely small. In U.S. Pat. No. 4,162,510 of Keizer a novel keel tipped pickup stylus structure is disclosed. The pickup stylus is part of the signal pickup assembly of a video disc record player. The assembly is housed in a protective housing such as the pickup cartridge described in Leedom, U.S. Pat. No. 3,952,147 which also facilitates replacement of the signal pickup assembly without any critical manual adjustments or connections.

Dholakia, in U.S. Pat. No. 4,077,050 describes a leaf spring or flylead for urging the stylus into the record groove. One end of the leaf spring is secured to the stylus and the second end is mounted within the cartridge above the stylus. The flylead provides stylus tracking pressure, properly locates the free end of the stylus arm relative to the carriage and establishes electrical connection between the electrode on the stylus and the signal processing circuitry of the player.

The flyleads are thin, for example, about 0.0002 to about 0.0008 inch (5.08–20.32 micrometers) thick and about 0.04 inch (2.5 centimeters) long, and are generally fabricated out of an electrically conductive metal. Thin beryllium copper alloy sheets may be used to fabricate the flyleads. The sheets are fragile and cannot be easily handled because they readily bend and kink. Also difficulties have been encountered in using standard photolithographic methods to fabricate the flyleads. For example, undercutting of the photoresist layer during development and of the beryllium copper sheet during etching are sometimes observed.

A solution to these problems is disclosed in the copending application of Dinardo, Jr., Ser. No. 081,486, filed Oct. 3, 1979. In the Dinardo, Jr. application a method for preparing a flylead for a video disc playback cartridge is taught which comprises the steps of laminating a dry film photoresist to both sides of a thin metal sheet, exposing one side to light through a patterned mask, developing the patterned side with a solvent developer to selectively remove certain photoresist areas, etching the resulting exposed metal sheet portions and removing the remaining photoresist from both sides of the etched metal sheet.

Further developments in the manufacture of the cartridge assembly have resulted in the need for a flylead which may be semi-automatically assembled. For this purpose it is desirable to have a flylead having one portion of a surface coated with a pattern of solder. It would therefore be desirable to have a method for preparing a flylead for use with a semi-automatic assembly process.

SUMMARY OF THE INVENTION

I have found a method for preparing a flylead from a beryllium copper alloy sheet having one side include a solder layer pattern. The method includes the steps of age hardening the beryllium copper alloy sheet, laminating both sides of the sheet with a dry film photoresist, exposing the first side of the laminated sheet to actinic radiation through a mask to record a first pattern comprising the flylead pattern, exposing the second side of the laminated sheet to actinic radiation through a mask to record a second pattern comprising the solder layer pattern, developing the second pattern to expose the alloy sheet surface, electroplating the exposed alloy sheet surface with a solder layer pattern, relaminating the electroplated second side, developing the first pattern, etching the first pattern into the alloy sheet, and removing the remaining photoresist from both sides of the etched alloy sheet.

DETAILED DESCRIPTION OF THE INVENTION

Figure 1:
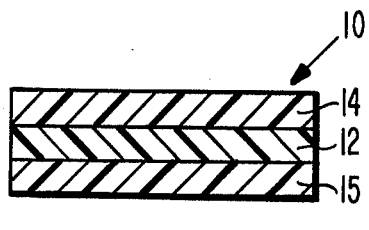
FIG. 1 is a schematic drawing of a dry film photoresist.

A dry film photoresist 10 which can be used in this invention is schematically shown in FIG. 1. The dry film photoresist 10 comprises a photoresist layer 12 sandwiched between a protective layer 14, for example, a polyester such as polyethylene terephthalate, and a backing layer 15, for example, a polyolefin such as polyethylene. A suitable dry film photoresist 10 is Riston 210R (E. I. duPont de Nemours Co.), an aqueous processable acrylic photopolymer photoresist layer 12 sandwiched between a polyester protective layer 14 and a polyolefin backing layer 15. Suitable compositions and layers for dry film photoresist 10 are discussed in Celeste, U.S. Pat. No. 3,469,982 and U.K. Pat. No. 1,275,471. Additional information can be found in DeForest, *Photoresist,* Chapter 6, McGraw-Hill Book Company, New York, 1975.

The flyleads may be fabricated out of a thin conductive metal. Alloys of copper and beryllium have been found to be particularly useful. A thin metal sheet 16 typically about 0.002–0.0008 inch (5.2–20.3 micrometers) thick preferably about 0.0005 inch (12.7 micrometers) may be used. In order to achieve the proper spring and etching characteristics it has been found necessary to age harden the rolled beryllium copper alloy sheet. Failure to heat treat the material prior to etching may lead to non-uniform etching which results in excessive scrap. If the sheet is not age hardened, the flyleads may not function well as springs. It is preferable to age harden the beryllium copper alloy sheet in an early step since the flyleads can then be readily solder plated. If the hardening process occurs after solder electroplating, the solder may flow and degrade during the heat treating step. A preferred method of age hardening consists of firing the sheet at about 310°–320° C., preferably about 315° C. in an inert atmosphere such as $N_2$ for about 2 hours. Depending on the history of the particular alloy sheet, variations in temperature may be required to achieve the desired properties.

Figure 2:
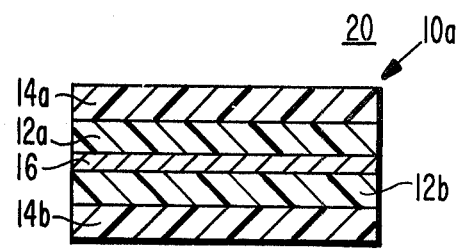
FIG. 2 is a schematic drawing of a metal sheet laminated on both sides with a dry film photoresist.

After the age hardening step is completed the metal sheet 16, for example, about 4 inches (10.2 centimeters) wide by about 7 inches (17.8 centimeters) long, is coated on the first side with a first dry film photoresist 10a and on the second side with a second dry film photoresist 10b forming coated sheet 20 shown in FIG. 2. The backing layer 15 from the dry film photoresist is removed prior to contacting the photoresist layer 12 with the metal sheet 16. A laminator having a continuous feed capability can be used to simultaneously coat both sides of the metal sheet 16. Because of the thickness of the photoresist layer 12 and the protective layer 14 on both sides of the metal sheet 16, a structure results which is relatively rigid thereby facilitating handling of the otherwise very delicate metal sheet 16.

As shown in FIG. 2, the laminated sheet 20 comprises the metal sheet 16 coated on each side with photoresist layers 12a and 12b, respectively, which are in turn covered with protective layers 14a and 14b, respectively. As illustrated, the coated sheet 20 has an increased working thickness of about 0.004 inch (101.6 micrometers) with each of the photoresist layers 12a and 12b and the protective layers 14a and 14b being approximately 0.001 inch (25.4 micrometers) thick.

Figure 3:
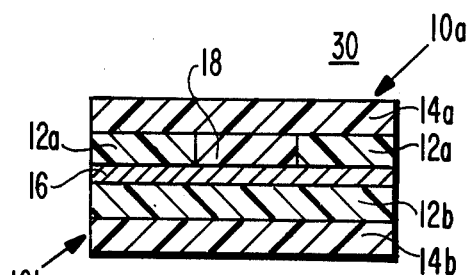
FIG. 3 is a schematic drawing of a laminated metal sheet following exposure through a mask on the first side.

The laminated sheet 20 is allowed to set up for about 15 to 30 minutes at room temperature. The first dry film photoresist 10a is then exposed through a mask to actinic radiation to which the first photoresist layer 12a is sensitive in order to transfer the flylead pattern to the first photoresist layer 12a. The mask may be a photographic negative of the flylead pattern. Because of the close tolerances required difficulties may be encountered if a contact printing method is utilized. A point light source is preferred in order to obtain the required resolution. A conventional projection printing method may be used. A coated metal sheet 30 after exposure on the first dry film photoresist 10a to record a flylead pattern is schematically shown in FIG. 3. For a negative working photoresist the first exposed photoresist area 18 of the first photoresist layer 12a is crosslinked. The first exposed photoresist area 18 corresponds to the part of the mask through which the effective actinic radiation has passed. Although only one first exposed photoresist area 18 is shown in FIG. 3, it is to be understood that a plurality of such exposed areas may be present.

Figure 4:
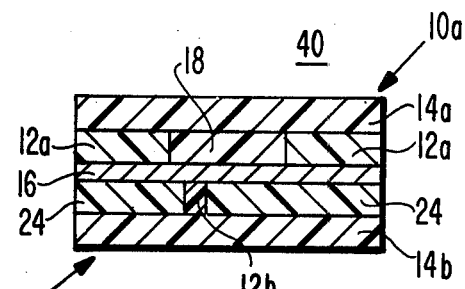
FIG. 4 is a schematic drawing of a laminated metal sheet following exposure through a mask on the second side.

Following exposure the coated, exposed metal sheet 30 is allowed to set up for at least about 15 minutes in order to complete the polymerization reaction initiated by the actinic radiation. The second photoresist layer 12b is then exposed to actinic radiation through a second mask in order to record the solder pattern in the second photoresist layer 12b. Following exposure of the second dry film photoresist 10b, the coated exposed metal sheet 20 which has now been doubly exposed, is allowed to set up for at least about 15 minutes. The resulting doubly exposed coated metal sheet 40 is shown in FIG. 4 where the second exposed photoresist area 24 has been crosslinked in the regions of the second photoresist layer 12b over the metal sheet 16 surfaces which will not be receiving solder.

Figure 5:
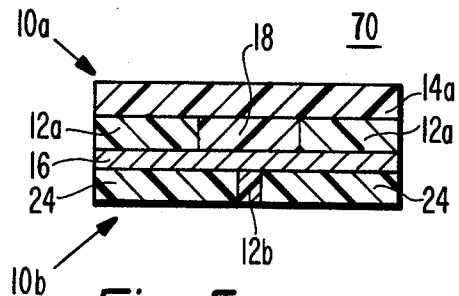
FIG. 5 is a schematic drawing of a laminated metal sheet after the protective layer of the second side has been removed.
Figure 6:
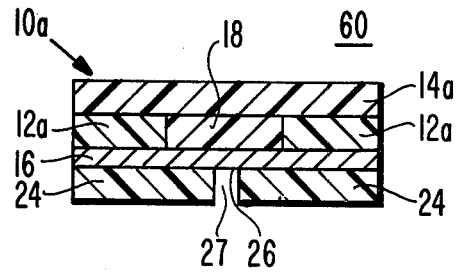
FIG. 6 is a schematic drawing of a laminated metal sheet after development of the second side.

The second protective layer 14b from the second dry film photoresist 10b is removed and the resulting structure in which the second photoresist layer 12b and second exposed photoresist area 24 are unprotected is shown in FIG. 5 as structure 50. The unexposed second photoresist layer 12b may be removed by an appropriate solvent developer. Alternative developing methods may also be employed. After development, the sample is rinsed with water and allowed to dry. The resulting second side developed structure 60 is shown in FIG. 6 with the second exposed photoresist area 24, the exposed first surface 26 of metal sheet 16, and the opening 27 left when the unexposed second photoresist layer 12b was removed. Although only one exposed metal sheet surface region is shown, it is to be understood that a plurality of such regions may be present.

Because there is a latent flylead pattern image recorded on the first dry film photoresist 10a, all work must be done in an appropriate "saft light" environment in order to preclude exposure of first photoresist layer 12a to light which can crosslink the unexposed areas.

Prior to electroplating the solder onto the exposed metal sheet first surface 26, any surface contamination or oxides on the exposed metal sheet first surface 26 must be removed. One method of preparing the exposed metal sheet first surface 26 employs an aqueous ammonium sulfate solution. For example, the developed structure 60 may be immersed in a 20% weight to volume ammonium sulfate solution. For a beryllium copper alloy generally an immersion time of one to four minutes depending on the rolling and heat treating history has been found to be adequate. The ammonium sulfate immersion lightly etches the exposed metal sheet surface 26 to remove oxides and other surface contaminants. The exposed metal sheet first surface 26 is rinsed with water and may then be immersed in a solution of sulfuric acid. For example, it has been found that at 10% solution of sulfuric acid for not less than about 15 seconds followed by a thorough water rinse removes any basic materials remaining on the exposed metal sheet first surface 26. Other suitable surface cleaning and preparation methods may also be employed.

The cleaned and developed structure 60 is then placed in a fixture which supports the structure 60 and permits electrical contact to the metal sheet 16 during the electroplating deposition of the solder pattern. The exposed metal sheet surface 26 may be electroplated by means of a standard 60-40 tin lead fluoboric acid plating solution. It has been found that a current of 0.40 amperes for 255 seconds is adequate if a beryllium copper alloy metal sheet 16 is employed.

Figure 7:
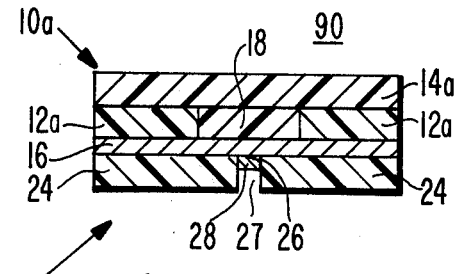
FIG. 7 is a schematic drawing of a laminated metal sheet after electroplating the second side.

After electroplating of the solder is completed, the electroplated structure 70 is rinsed with water and dried. Electroplated structure 70 is shown in FIG. 7. The solder layer 28 lies above the exposed metal sheet first surface 26 and fills in a portion of the opening 27. The second dry film photoresist 10b is then coated with a third dry film photoresist 10c in order to protect the solder layer 28 during the further development and processing steps.

Figure 8:
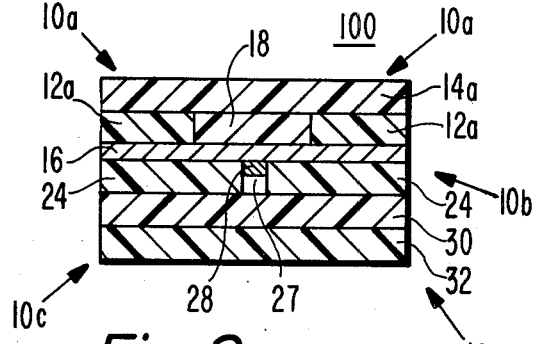
FIG. 8 is a schematic drawing of a laminated metal sheet after the electroplated side has been relaminated.

The protected structure 80 is shown in FIG. 8. The third photoresist layer 30 and third protective layer 32 comprise the third dry film photoresist 10c. The backing layer was removed from the third dry film photoresist 10c prior to laminating the third dry film photoresist onto the electroplated structure 70 and is therefore not shown in FIG. 8. Although the relamination step has been described using a dry film photoresist as the relaminant, any relaminant may be employed which is compatible with the remaining processing steps, serves to protect the solder layer 28 and which may be applied and removed without adversely affecting the desired properties of the other materials.

Figure 9:
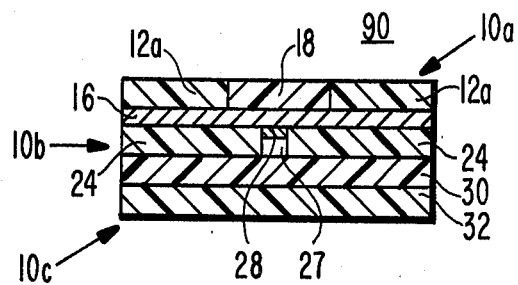
FIG. 9 is a schematic drawing of a laminated metal sheet after the first protective layer has been removed from the first side.
Figure 10:
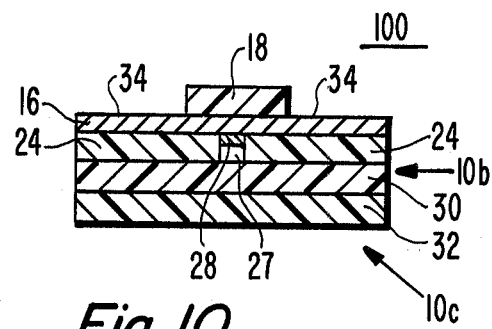
FIG. 10 is a schematic drawing of a laminated metal sheet after the first side has been developed.

The first unexposed photoresist layer 12a and the first exposed photoresist area 18, which corresponds to the flylead pattern image are now developed. The first protective layer 14a is removed. The resulting unprotected structure 90 is shown in FIG. 9. The unexposed first photoresist layer 12a may be removed by solvent development. Alternative developing methods may also be employed. The first dry film photoresist 10a developed structure 100 is shown in FIG. 10. The unexposed first layer 12a has been removed by the development step to expose a second surface 34 of metal sheet 16.

The metal sheet second surface 34 is then etched to transfer the flylead pattern to the metal sheet 16. A convenient etch for a beryllium copper alloy is a ferric chloride aqueous solution. In one embodiment a spray etcher using 42° Be' ferric chloride solution has been found to be useful for a beryllium copper alloy. Under these conditions the time needed to etch the metal sheet 16 below second metal sheet surface 34 has been found to vary from about 35 seconds to at least about 90 seconds, depending on the history and properties of the particular beryllium copper sheet. The first exposed photoresist area 18 protects the metal sheet 16 which lies directly underneath so that those regions of the metal sheet 16 are not etched.

Figure 11:
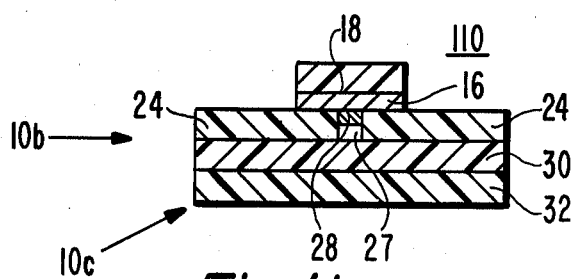
FIG. 11 is a schematic drawing of a laminated metal sheet after etching.

The resulting etched structure 110 is shown in FIG. 11. The metal sheet 16 beneath the metal sheet second surface 34 has been etched.

Figure 12:
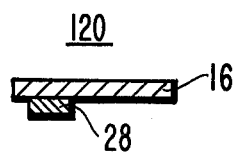
FIG. 12 is a schematic drawing of the finished flylead.

The third protective layer 32 is then removed and the remaining photoresist regions, including the first exposed photoresist area 18, second exposed photoresist area 24 and the third unexposed photoresist layer 30 are removed. A suitable solvent for removing the photoresist includes acetone, methylene chloride, and the like. The finished flylead 120 shown in FIG. 12 includes a metal sheet 16 and a solder layer 28. Although the preparation of a single flylead has been discussed, it may be advantageous to have multiple flyleads and regions to support the flyleads prepared on a single sheet using appropriate masks.

Although the process has been described using a dry film negative photoresist, it is to be understood that a dry film positive photoresist or other combinations of photoresist layers and protective layers may be employed.

This invention will be further illustrated by means of the following example, but it is to be understood that the invention is not meant to be limited by the details described therein.

EXAMPLE

A 0.0005 inch (12.6 micrometers) thick sheet of Berylco 25 beryllium copper alloy was employed. Berylco 25, available from Kaweci Berylco Industries, Inc., comprises 1.8 to 2% beryllium, a minimum 0.2% cobalt plus nickel, a maximum of 0.6% cobalt plus nickel plus iron and a minimum of 99.5% of copper plus the named elements.

The beryllium copper alloy sheet was age hardened by firing a sheet at 315° C.±5° C. in an inert atmosphere of nitrogen for two hours. After the sheet had cooled to room temperature it was coated on both sides with Dupont Riston 210R dry film photoresist using a Dupont model A24 laminator. The coated sheet was allowed to set up for thirty minutes at room temperature. The sheet was cut into working pieces of about 4 inches (10.2 centimeters) wide by about 7 inches (17.8 centimeters) long and trimmed to the edge of the metal sheet.

The first side of the sheet was exposed by means of a suitable mask using an 8000 watt pulsed xenon lamp spaced 12 feet (3.7 meters) from the substrate in order to approximate a point light source. The exposure time was carefully controlled by means of a Berkey Ascor Dual Range light integrater that turns off the lamp when the desired amount of light has been delivered to the photoresist to be exposed. For the exposure steps the coated metal sheet was placed between a registered pair of photographic negatives on a two-sided vacuum exposure frame. The first negative contained the flylead pattern and the second negative, accurately registered with the first negative, contained the solder pattern, which was in the shape of a donut. The frame was evacuated to make hard contacts between the negatives and the coated metal sheet. The lamp was turned on and one side was exposed. The frame is then rotated 180° and the other side was exposed. An exposure time of about 2 minutes was required for each side.

After exposure of both sides, the exposed photoresist covered metal sheet was removed from the vacuum exposure frame and the image was allowed to harden for not less than 15 minutes. The polyester protective sheet was removed from the side to be electroplated with solder. The side to be electroplated was then developed in a Dupont Model A24 processor for about 125 seconds using Riston II Developer 2000 and then rinsed in water for about 30 seconds and dried.

The coated sheet was then immersed in a 20% weight to volume solution of ammonium persulfate for 4 minutes. The sheet was rinsed in water and then immersed in a 10% volume to volume solution of sulfuric acid for 15 seconds followed by a thorough water rinse. The sample was placed in a fixture that supports it and permits electrical contact to the metal sheet during electroplating. The exposed areas of the metal sheet were solder plated in a 60-40 tin lead fluoboric acid plating solution using a current of 0.40 amperes for 255 seconds. The sample was then removed, rinsed with water, and dried.

The coated sheet side which included the plated solder pattern was laminated in a Dupont Model A24 laminator with Dupont Riston 210R dry photoresist. During this lamination, the sample was placed on a 0.02 inch (0.51 millimeter) thick stainless steel sheet. The steel sheet allowed only the coated sample side containing the solder layer to be laminated and served to keep the flylead latent image from being distorted during the lamination process. The coated relaminated sample is removed from the steel sheet support and the protective polyester sheet is removed from the sample having the undeveloped flylead pattern. The flylead pattern is then developed for 130 seconds in a Dupont Model A24 processor using Riston II Developer 2000. The sample was then rinsed in water and dried.

The flylead pattern was etched into the beryllium copper alloy sheet using a Chemcut Model 315 etcher. A ferric chloride aqueous solution having a density of 42° Be' was employed as the etch solution at 130° F. (55° C.). An etching time of between 55 and 60 seconds was needed.

After etching, the sample was rinsed with water and allowed to dry. The remaining protective polyester sheet was removed and the remaining photoresist on both sides was removed using acetone. Several trays containing acetone were employed sequentially. The resulting sample was visually free of photoresist and was allowed to dry in an oil-free environment. The flylead edges were well defined. The walls were straight and perpendicular to the faces. Any openings in the beryllium copper alloy or solder were well defined and uniform. The thicknesses of the beryllium copper flylead and of the solder layer were uniform.

I claim:

1. A method for preparing a flylead from a beryllium copper alloy sheet having one side include a solder layer pattern comprising the steps of:
   (a) age hardening the beryllium copper alloy sheet;
   (b) laminating both sides of the alloy sheet with a dry film photoresist;
   (c) exposing the first side of the laminated alloy sheet to actinic radiation to record a first pattern comprising the flylead pattern;
   (d) exposing the second side of the laminated alloy sheet to actinic radiation to record a second pattern comprising the solder layer pattern;
   (e) developing the second pattern to expose the alloy sheet surface;
   (f) electroplating the exposed alloy sheet surface with a solder;
   (g) relaminating the electroplated alloy sheet second side;
   (h) developing the first pattern;
   (i) etching the first pattern into the alloy sheet; and
   (j) removing the remaining photoresist from both sides of the etched alloy sheet to obtain a flylead having one side include a solder layer pattern.

2. The method in accordance with claim 1 wherein the electroplated second side is relaminated with a dry film photoresist.

3. A method in accordance with claim 1 wherein the electroplating step employs a lead tin fluoboric acid aqueous solution.

4. A method in accordance with claim 1 wherein the etching step employs an aqueous ferric chloride solution.

5. A method in accordance with claim 1 wherein the dry film photoresist is negative working.